United States Patent [19]

Lhotak

[11] Patent Number: 4,973,257
[45] Date of Patent: Nov. 27, 1990

[54] BATTERY TERMINAL

[75] Inventor: Roger W. Lhotak, Elburn, Ill.

[73] Assignee: The Chamberlain Group, Inc., Elmhurst, Ill.

[21] Appl. No.: 479,470

[22] Filed: Feb. 13, 1990

[51] Int. Cl.[5] ................. H01R 13/405; H01R 13/428
[52] U.S. Cl. ..................... 439/81; 439/83; 439/751; 439/862
[58] Field of Search .................. 439/78–81, 439/83, 84, 741, 743, 751, 870, 873, 733, 834, 861, 862, 869

[56] References Cited

U.S. PATENT DOCUMENTS

| | | | |
|---|---|---|---|
| 1,849,595 | 3/1932 | Shaw | 439/830 |
| 2,741,751 | 4/1956 | Weiler | 339/217 |
| 2,818,463 | 12/1957 | Parker | 136/173 |
| 2,942,228 | 6/1960 | Swick | 439/743 |
| 3,445,803 | 5/1969 | Johnston et al. | 338/17 |
| 3,479,634 | 11/1969 | Pritulsky | 339/17 |
| 3,742,430 | 6/1973 | Cairns et al. | 339/252 R |
| 3,871,738 | 3/1975 | Dechelette | 439/870 |
| 4,247,603 | 1/1981 | Leffingwell et al. | 421/1 |
| 4,332,430 | 6/1982 | Clark | 339/17 C |
| 4,414,298 | 11/1983 | Krenz | 429/99 |

FOREIGN PATENT DOCUMENTS 234367 9/1987 European Pat. Off. ............. 439/78

Primary Examiner—Gary F. Paumen
Attorney, Agent, or Firm—Fitch, Even, Tabin & Flannery

[57] ABSTRACT

The present invention is directed to an electric terminal formed from a single metal strip for use in mounting a terminal bearing electrical device on a printed circuit board. The electric terminal is formed from a strip of resilient, electrically conductive metal bent at a first end and a second end to form an elongated generally C-shaped terminal member having a back wall and two front wall sections extending from the distal end of the first end and the second end back toward the center of the back wall. The first end is bent to provide a generally hemispherical distal radius so that the first wall section of the terminal member is aligned substantially parallel to the back wall of the terminal member. The terminal member has opposed, outwardly extending spherical domes formed in a central portion of the back wall and the first front wall at the first end. The second end is bent at less than a hemispherical distal radius so that the second front wall of the second end extends away from the back wall at the second end. The second end has three downwardly depending mounting tabs extending from the back wall, the second front wall and the second end distal radius, respectively. The mounting tabs are spaced to engage mounting slots on a printed circuit board. The second front wall of the second end is urged toward the back wall against the restorative force of the resilient metal strip. The terminal member snaps into position on the printed circuit board with a force moment created by the restorative force generated by the resilient metal strip and to the resistance of the back wall tab and the precluded restorative motion of the displaced second front wall tab. This force moment acts to align and hold the terminal member in a position ready for soldering without the use of special fixtures.

6 Claims, 2 Drawing Sheets

BATTERY TERMINAL

FIELD OF INVENTION

The present invention relates generally to electric terminals used in printed circuit boards. More particularly, the present invention relates to an electric terminal formed from a single metal strip which is mounted on a printed circuit board for use in securing a terminal bearing electrical device, such as a battery, to the printed circuit board.

BACKGROUND OF THE INVENTION

It is common practice to provide power to a printed circuit board for an electric product by an arrangement wherein a battery is secured in a compartment integral with, or fixed to, the casing for the product. The battery compartment has terminals which engage opposite ends of the batteries. Wires are connected between the battery terminals and the printed circuit board for powering the electric circuit on the board after a battery is inserted in the compartment. This approach is associated with high labor costs which are incurred in the installation of the battery terminals and in the connection of the wires to the battery terminals and the printed circuit board.

Various approaches have been suggested for lowering the labor cost incurred in providing battery terminals connected to a printed circuit board.

U.S. Pat. No. 2,818,463 to Parker discloses a battery contact as may best be seen in FIG. 5, having a battery contacting Part 11 and a housing contacting Part 12. The contact No. 8 includes longitudinally extending parts or walls 9 and 10 for being fitted over a side wall 1 of a battery container.

U.S. Pat. No. 4,414,298 to Krenz discloses a battery contact 14 or 16 for solder connection to an aperture 28 of a printed circuit board. Battery contacts 14 and 16 are generally Z-shaped with internal legs 34 for making electrical and resilient mechanical engagement with a terminal of a battery.

U.S. Pat. No. 3,742,430 to Cairns et al., is directed to a terminal for connecting a lead to a printed circuit board.

U.S. Pat. No. 4,332,430 to Clark discloses a 3-legged connector for solder connection with apertures located on a printed circuit board and which terminates in a spade type connector, or the like.

U.S. Pat. No. 3,479,634 to Pritulski is directed to an interconnect system for electrically connecting conductors to printed circuit boards. A pair of legs 36, extending from the lower portion of the connector, are insertable within apertures 24 in a printed circuit board and bent after insertion for a secure mounting. A contact 50 extends from one side of the connector. The arm 50 has a contact member 52 and the arm terminates in a pair of spring contacts 54. The contact arm is arranged so as to receive an edge of a printed circuit board, or the like, between the contacts 52 and 54. The upper contact member 54 engages the upper surface of the printed circuit board to hold the board in place while the lower contact member 52 makes an electrical contact with the circuitry on the board to complete the electrical connection between the circuitry strips on the board and wire conductors located within the connector.

U.S. Pat. No. 4,247,603 to Leffingwell et al. provides a battery case which is mounted directly on a printed circuit board. Terminal pins are provided which are directly affixed to the cell terminals so as to restrain the cell terminals from movement relative to the base portion of a printed circuit board prior to joining a cover portion to the base portion. The terminal pins project from the case through the base for fixing the case and the storage cell to a printed circuit board and for electrically connecting the storage cell to the circuit of the printed circuit board.

While the above described prior art provides various approaches to the provision of terminals for mounting a terminal bearing electrical device, such as a battery, there is a need for a simple one piece electric terminal which can be mounted on a printed circuit board in a self-aligning position and maintained in that position until soldering can be effected by high production soldering techniques, such as wave soldering.

Accordingly, it is a principal object of the present invention to provide an electric terminal formed from a single metal strip for use in mounting a terminal bearing electrical device on a printed circuit board.

It is another object of the present invention to provide an electric terminal which can be used in pairs without requiring a second mirror image of the terminal to be provided.

It is a further object of the present invention to provide an electric terminal which can be positioned on a printed circuit board and which will be self-aligning in a position and retained in the position until soldering can be effected by high speed soldering techniques, such as wave soldering.

These and other objects of the present invention will become more apparent from the following detailed description and the appended claims.

SUMMARY

The present invention is directed to an electric terminal formed from a single metal strip for use in mounting a terminal bearing electrical device on a printed circuit board. The electric terminal is formed from a strip of resilient, electrically conductive metal bent at a first end and a second end to form an elongated generally C-shaped terminal member having a back wall and two front wall sections extending from the distal end of the first end and the second end back toward the center of the back wall.

The first end is bent to provide a generally hemispherical distal radius so that the first wall section of the terminal member is aligned substantially parallel to the back wall of the terminal member. The terminal member has opposed, outwardly extending spherical domes formed in a central portion of the back wall and the first front wall at the first end.

The second end is bent at less than a hemispherical distal radius so that the second front wall of the second end extends away from the back wall at the second end. The second end has three downwardly depending mounting tabs extending from the back wall, the second front wall and the second end distal radius, respectively. The mounting tabs are spaced to engage mounting slots on a printed circuit board. The second front wall of the second end is urged toward the back wall against the restorative force of the resilient metal strip. The terminal member snaps into position on the printed circuit board with a force moment created by the restorative force generated by the resilient metal strip due to the resistance of the back wall tab and the precluded restorative motion of the displaced second front wall tab. This force moment acts to align and hold the terminal member in a position ready for soldering without the use of special fixtures.

DETAILED DESCRIPTION OF THE INVENTION

Figure 1:
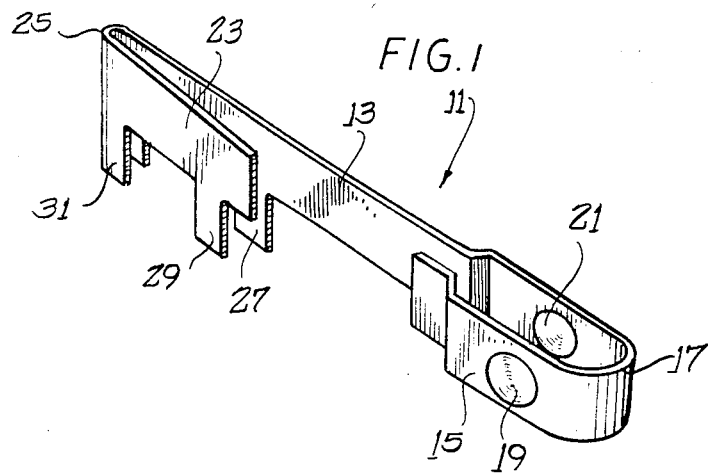
FIG. 1 is an isometric drawing of the electric terminal of the present invention.

As shown in FIG. 1, the terminal member 11 is formed from a single metal strip into an elongated generally C-shaped conformation. The metal strip is a resilient, electrically conductive metal, such as phosphor bronze, tin-plated spring steel, spring brass, monel, beryllium copper, or nickel silver. Preferably, the electric terminal is formed from a metal strip of phosphor bronze.

Figure 2:
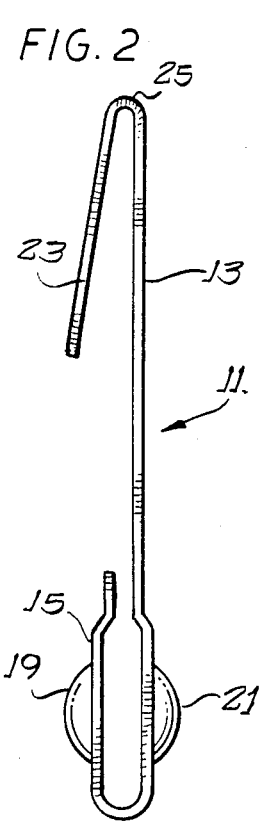
FIG. 2 is a top view of the electric terminal of FIG. 1.

As best seen in FIGS. 1 and 2, the metal strip is bent at a first end to provide a distal radius 17 that is substantially hemispherical, i.e. 180° to form a first front wall section 15 that is aligned substantially parallel to a back wall 13. Spherical contact domes 19 and 21 are formed in the front wall 15 and the back wall 13, respectively. As shown in FIG. 2, the spherical domes 19 and 21 extend outwardly from the front wall 15 and the back wall 13. In an alternate embodiment of the present invention, one of the spherical domes 19 or 21 could extend inwardly. This would provide a dish-shaped section for reception of an electrical terminal, such as the positive end of a battery.

The metal strip is bent at a second end to provide a second front wall 23. The distal radius 25 of the bend at the second end is less than hemispherical, i.e. less than 180°, so that the front wall 23 extends away from back wall 13.

Figure 3:
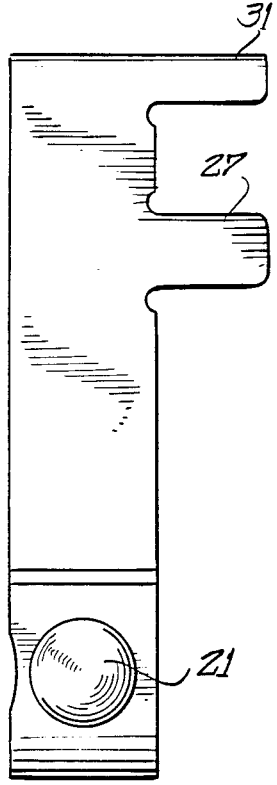
FIG. 3 is a left side view of the electric terminal of FIG. 1.
Figure 4:
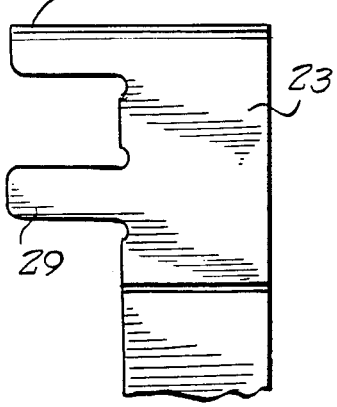
FIG. 4 is a right side view of the lower leg of the electric terminal of FIG. 1.
Figure 5:
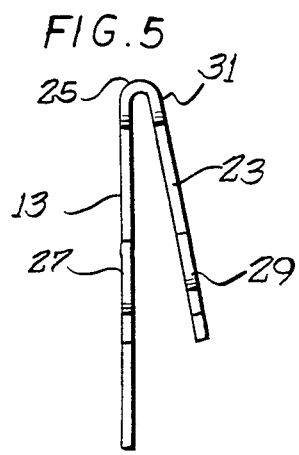
FIG. 5 is a bottom side view of the lower portion of the electric terminal of FIG. 2.

As best seen in FIGS. 1, 3 and 4, three downwardly depending mounting tabs are provided on the metal strip. One of the mounting tabs 27 extends from the back wall 13. A second mounting tab 29 extends from the second front wall 23. The third mounting tab 31 is a radial mounting tab that extends from the distal radius 25 of the terminal member 11. In an important embodiment, the edges of the backwall mounting tab 27 and the sidewall mounting tab which are nearest to the distal radius mounting tab 31 are in substantial alignment in the mounted position, described below.

Figure 7:
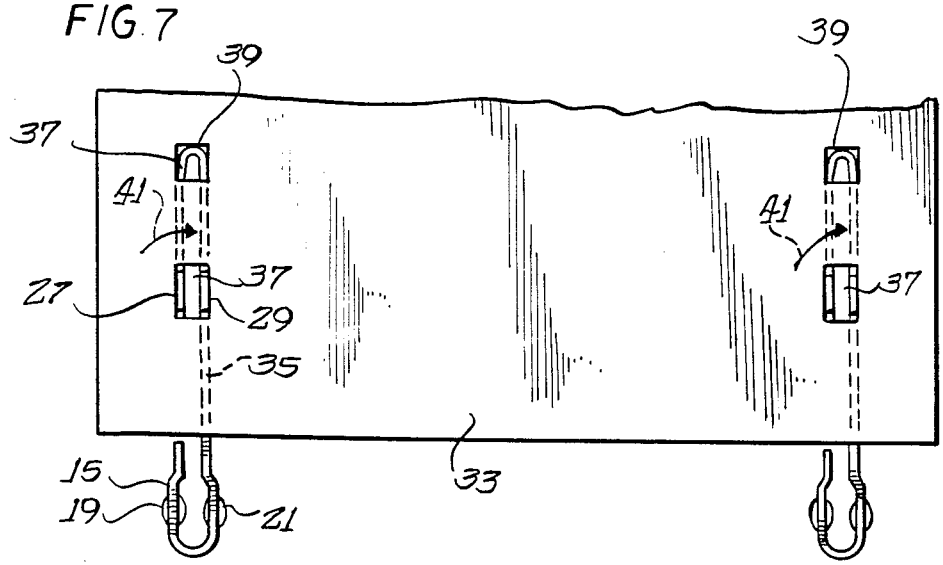
FIG. 7 is a top view of the printed circuit board of FIG. 6 showing slots adapted to receive the electric terminal of FIG. 1.

As best seen in FIG. 7, slots 37 are provided in a printed circuit board 33 for reception of the mounting tabs 27 and 29. Slots 39 are provided for reception of mounting tabs 31. Slots 39 are sized to receive tab 31 in a relatively close fit to prevent lateral movement of terminal 11 after mounting. Slots 37 may be made slightly oversize, as shown, in the lengthwise direction to facilitate ease of insertion. Some like parts in the two terminals 11 depicted in FIG. 7 have not been numbered In use, the second front wall 23 is urged against the restorative force of the resilient metal strip into a position suitable for inserting mounting tabs 27, 29 and 31 into slots 37 and 39. After insertion, the restorative force of the resilient metal strip acts to urge front wall 23 outwardly against slot 37 and create a force moment shown by the arrows 41 in FIG. 7. The force moment acts to align he terminal member along self-alignment edge 35. The terminal member 11 is held in self-alignment along the self-alignment edge 35 until an appropriate time for soldering by high speed processes, such as wave soldering, can be provided.

In a preferred embodiment, the back wall mounting tab 27 has a greater width than the front wall mounting tab 29 to provide a more stable base upon which the force moment acts. Preferably back wall mounting tab 27 is from about 20% to about 100% wider than front wall mounting tab 29.

The dimensions of terminal member 11 are not critical and can be changed to accommodate the type of terminal bearing electrical device which is to be mounted. By way of example, but in no way intended to be limiting, a terminal member suitable for mounting an alkaline 12 V battery, size 23A, could have the following dimensions: length from distal radius 17 to distal radius 25 of 0.75 inches; width (exclusive of the length of the mounting tabs) of 0.16; length of mounting tabs of 0.12; width of back wall mounting tab 27 of 0.075; width of front wall mounting tab 29 of 0.055; each spherical dome having a spherical radius of 0.06; a length of first front wall 15 of 0.22; a length of second front wall 23 of 0.25 and the metal strip being 30 gauge (0.01) Grade "A" phosphor bronze, spring temper ASTM B103A.

Figure 6:
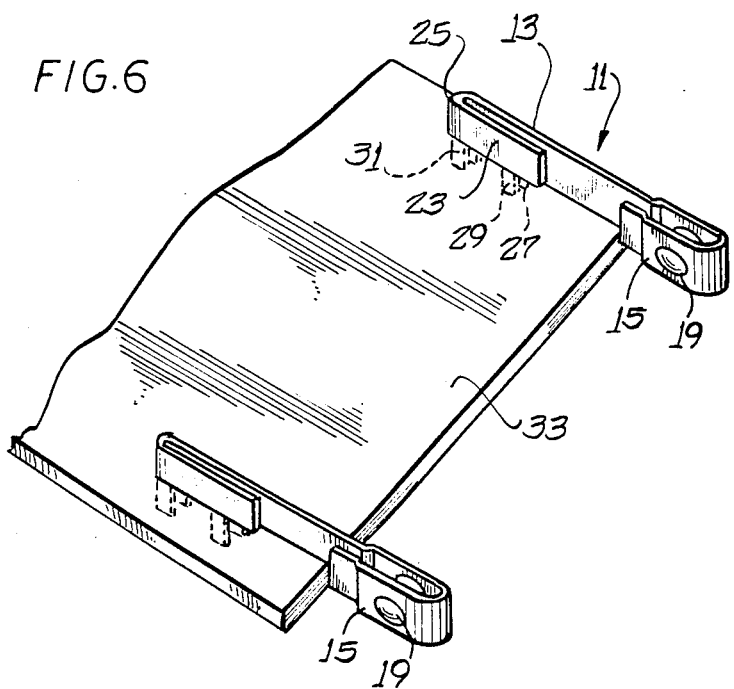
FIG. 6 is an isometric view showing a pair of electric terminals of FIG. 1 mounted on a printed circuit board.

A pair of terminal members 11 are shown in mounted position in FIG. 6. As seen in FIG. 6, the pair of terminal members are identical in shape, but still provide electric terminals through the outwardly extending spherical domes 19 and 21.

While particular embodiments of the invention have been shown and described, it will be obvious to those skilled in the art that changes and modifications may be made without departing from the invention in its gaudiest aspects. The scope of the invention is defined in the appended claims and is intended to cover all such changes and modifications as fall within the true spirit and scope of the invention.

What is claimed is:

1. An electric terminal formed from a single metal strip for use in mounting a terminal bearing electrical device on a printed circuit board, comprising a strip of resilient, electrically conductive metal bent at a first end and a second end to form an elongated generally C-shaped terminal member having a backwall and first and second front wall sections extending from each said end back toward the center of said back wall, said first end being bent to provide a hemispherical, first distal radius so that said first wall section of said member is aligned substantially parallel to said backwall of said member, said terminal member having opposed, outwardly extending spherical domes formed in a central portion of said strip at said first end, said second end being bent at less than a hemispherical second distal radius so that said second front wall of said second end extends away from said backwall at said second end, and said second end having three downwardly depending mounting tabs extending from said backwall, said second front wall and said second end distal radius, respectively, said mounting tabs being spaced to engage mounting slots on a printed circuit board when said second front wall of said second end is urged toward said backwall against the restorative force of said second distal radius whereby said member snaps into position on said board with the force moment created by said backwall tab and said second front wall tab acting to align and hold said member in a position ready for soldering without the use of special fixtures.

2. An electrical terminal in accordance with claim 1 wherein one of said spherical domes extends inwardly.

3. An electrical terminal in accordance with claim 1 wherein the edges of said backwall mounting tab and said front wall mounting tab which are nearest to said distal radius mounting tab are in substantial alignment in the mounted position.

4. An electrical terminal in accordance with claim 1 wherein the width of said backwall mounting tab is from 20% to 100% greater than the width of said front wall mounting tab.

5. An electrical terminal in accordance with claim 1 wherein said metal strip is formed from a metal selected from the group consisting of phosphor bronze, tin-plated spring steel, spring brass, monel, beryllium copper and nickel silver.

6. An electrical terminal in accordance with claim 5 wherein said metal strip is formed from phosphor bronze.

* * * * *

UNITED STATES PATENT AND TRADEMARK OFFICE
CERTIFICATE OF CORRECTION

PATENT NO. : 4,973,257

DATED : November 27, 1990

INVENTOR(S) : Roger W. Lhotak

It is certified that error appears in the above-identified patent and that said Letters Patent is hereby corrected as shown below:

In the Abstract, starting at line 9, delete "The first end is bent to provide a generally hemispherical distal radius so that the first wall section of the terminal member is aligned substantially parallel to the back wall of the terminal member. The terminal member has opposed, outwardly extending spherical domes formed in a central portion of the back wall and the first front wall at the first end. The second end is bent at less than a hemispherical distal radius so that the second front wall of the second end extends away from the back wall at the second end."

Column 4, line 2, after "numbered" insert a period.

Column 4, line 10, change "he" to --the--.

UNITED STATES PATENT AND TRADEMARK OFFICE
CERTIFICATE OF CORRECTION

PATENT NO. : 4,973,257

DATED : November 27, 1990

INVENTOR(S) : Roger W. Lhotak

It is certified that error appears in the above-identified patent and that said Letters Patent is hereby corrected as shown below:

Column 4, line 58, after "hemispherical" delete the comma.

Signed and Sealed this

Seventh Day of July, 1992

Attest:

DOUGLAS B. COMER

*Attesting Officer*  *Acting Commissioner of Patents and Trademarks*